United States Patent
Lee et al.

(10) Patent No.: US 10,804,749 B2
(45) Date of Patent: Oct. 13, 2020

(54) METHOD FOR DETECTING FOREIGN OBJECT, WIRELESS POWER TRANSFER CONTROL APPARATUS, AND WIRELESS POWER TRANSFER APPARATUS USING THE SAME

(71) Applicants: HYUNDAI MOTOR COMPANY, Seoul (KR); KIA MOTORS CORPORATION, Seoul (KR); RESEARCH & BUSINESS FOUNDATION SUNGKYUNKWAN UNIVERSITY, Suwon-si, Gyeonggi-do (KR)

(72) Inventors: Woo Young Lee, Yongin-si (KR); Gyu Yeong Choe, Suwon-si (KR); Jae Eun Cha, Gwangmyeong-si (KR); Min Jung Kim, Suwon-si (KR); Byoung Kuk Lee, Yongin-si (KR); Min Kook Kim, Suwon-si (KR); Sang Joon Ann, Suwon-si (KR); Jong Eun Byun, Suwon-si (KR)

(73) Assignees: Hyundai Motor Company, Seoul (KR); Kia Motors Corporation, Seoul (KR); Research & Business Foundation Sungkukwan University, Suwon-si, Gyeonggi-do (KR)

( * ) Notice: Subject to any disclaimer, the term of this patent is extended or adjusted under 35 U.S.C. 154(b) by 334 days.

(21) Appl. No.: 15/915,425

(22) Filed: Mar. 8, 2018

(65) Prior Publication Data
US 2019/0052126 A1    Feb. 14, 2019

(30) Foreign Application Priority Data
Aug. 10, 2017   (KR) .......................... 10-2017-0101797

(51) Int. Cl.
*H02J 50/60* (2016.01)
*H02J 50/12* (2016.01)
(Continued)

(52) U.S. Cl.
CPC .............. *H02J 50/60* (2016.02); *G01R 25/04* (2013.01); *H02J 50/12* (2016.02);
(Continued)

(58) Field of Classification Search
None
See application file for complete search history.

(56) References Cited

U.S. PATENT DOCUMENTS

| 2017/0018977 | A1   | 1/2017 | Van Wageningen et al. |
| 2018/0076671 | A1 * | 3/2018 | Chopra ................... B60L 53/66 |
| 2018/0212476 | A1 * | 7/2018 | Nguyen ................ H01F 38/14 |

FOREIGN PATENT DOCUMENTS

| JP | 2017-511109 A   | 4/2017 |
| KR | 10-2014-0008130 A | 1/2014 |

OTHER PUBLICATIONS

Korean Office Action issued in Application No. 10-2017-0101797 dated Aug. 22, 2018.

* cited by examiner

*Primary Examiner* — Jared Fureman
*Assistant Examiner* — Aqeel H Bukhari
(74) *Attorney, Agent, or Firm* — Morgan, Lewis & Bockius LLP

(57) ABSTRACT

A method for detecting a foreign object between a transmission pad and a reception pad for wireless power transfer (WPT) may comprise: performing, by a processor, a zero phase angle (ZPA) control for a power transfer converter included in or connected to the transmission pad; detecting, by the processor, a phase difference between an input current
(Continued)

and an input voltage of the power transfer converter; and determining, by the processor, whether or not the foreign object exists between the transmission pad and the reception pad by comparing the phase difference with a reference value.

20 Claims, 7 Drawing Sheets

(51) Int. Cl.
    *G01R 25/04*     (2006.01)
    *H02M 3/335*     (2006.01)
    *H02M 7/06*     (2006.01)
    *H02J 7/02*     (2016.01)
    *H02M 7/5387*     (2007.01)
    *B60L 53/12*     (2019.01)
    *H02M 7/48*     (2007.01)

(52) U.S. Cl.
    CPC ......... *H02M 3/33569* (2013.01); *B60L 53/12* (2019.02); *H02J 7/025* (2013.01); *H02M 7/06* (2013.01); *H02M 7/5387* (2013.01); *H02M 2007/4815* (2013.01)

METHOD FOR DETECTING FOREIGN OBJECT, WIRELESS POWER TRANSFER CONTROL APPARATUS, AND WIRELESS POWER TRANSFER APPARATUS USING THE SAME

CROSS-REFERENCE TO RELATED APPLICATION

The present application claims the benefit of priority to Korean Patent Application No. 10-2017-0101797 filed on Aug. 10, 2017, the entire content of which is incorporated herein for all purposes by this reference.

TECHNICAL FIELD

The present disclosure relates to a method for detecting a foreign object, and a wireless power transfer (WPT) control apparatus and a WPT apparatus using the same, and more particularly, to a method for detecting a foreign object between a transmission pad and a reception pad for WPT, and a WPT control apparatus and a WPT apparatus using the same.

BACKGROUND

An electric vehicle (EV) charging system may basically be defined as a system for charging a high-voltage battery mounted on an EV by using power of an energy storage device or a power grid of a commercial power source. Such the EV charging system may have various forms according to the type of EV. For example, the EV charging system may be classified into a conductive type using a charging cable and a non-contact wireless power transfer (WPT) type (also referred to as an 'inductive type').

In the case of the inductive type charging using a WPT system, when a high-voltage battery mounted on the EV is to be charged, the EV may be positioned to a ground assembly (GA) located in a charging station or a charging spot capable of EV charging.

Especially, a magnetic induction type WPT system uses an electromagnetic induction phenomenon between a transmission coil in the GA and a reception coil in a vehicle assembly to transfer electric power. When charging the EV, the reception coil in the VA mounted on the EV makes an inductive resonance coupling with the transmission coil in the GA located in the charging station or the charging spot, and charges the battery in the EV using power transferred from the GA through the inductive resonance coupling.

However, when a foreign object, which may affect a magnetic field, exists between the transmission coil and the reception coil, such as metal or magnetic material, there is a direct influence on the resonant network of the WPT system, thereby causing abnormal operation of the system or reduction in power transfer efficiency. Further, due to the presence of the foreign object, a temperature of the foreign object may sharply increase, causing a problem in the system stability.

SUMMARY

Embodiments of the present disclosure provide a method for detecting a foreign object between a transmission pad and a reception pad for WPT.

Embodiments of the present disclosure also provide a WPT control apparatus using the method for detecting a foreign object.

Embodiments of the present disclosure also provide a WPT apparatus including the WPT control apparatus.

According to an exemplary embodiment of the present disclosure, a method for detecting a foreign object between a transmission pad and a reception pad for wireless power transfer (WPT) may comprise: performing, by a processor, a zero phase angle (LPA) control for a power transfer converter included in or connected to the transmission pad; detecting, by the processor a phase difference between an input current and an input voltage of the power transfer converter; and determining, by the processor, whether or not the foreign object exists between the transmission pad and the reception pad by comparing the phase difference with a reference value.

The phase difference may be obtained using a length of a time interval during which the input current and the input voltage have different polarities. The determining may further comprise comparing the length of the time interval during which the input current and the input voltage have different polarities with a first reference value; and determining that a foreign object exists between the transmission pad and the reception pad when the length of the time interval exceeds the first reference value.

The phase difference may be obtained using a length of a time interval during which the input current and the input voltage have a same polarity.

The determining may further comprise comparing the length of the time interval during which the input current and the input voltage have the same polar with a second reference value; and determining that a foreign object exists between the transmission pad and the reception pad when the length of the time interval is less than the second reference value.

When the ZPA control is performed for the power transfer converter and a foreign object does not exist between the transmission pad and the reception pad, the length of the time interval during which the input current and the input voltage have different polarities may become a value of 0.

The method may further comprise, in response to determining that a foreign object exists between the transmission pad and the reception pad, controlling the power transfer converter to make the WPT be stopped.

The ZPA control may be a control that causes an input voltage and the input current of the power transfer converter to be in-phase.

In accordance with another embodiment of the present disclosure, a wireless power transfer (WPT) control apparatus may comprise at least one processor and a memory storing at least one instruction executed by the at least one processor. The at least one instruction may cause the at least one processor to: perform a zero phase angle (ZPA) control for a power transfer converter included in or connected to the transmission pad; detect a phase difference between an input current and an input voltage of the power transfer converter; and determine whether or not a foreign object exists between the transmission pad and a reception pad for the WPT by comparing the phase difference with a reference value.

The phase difference may be obtained using a length of a time interval during which the input current and the input voltage have different polarities.

The length of the time interval, during which the input current and the input voltage have different polarities, may be compared with a first reference value, and the foreign object may exist between the transmission pad and the reception pad when the length of the time interval exceeds the first reference value.

The phase difference may be obtained using a length of a time interval during which the input current and the input voltage have a same polarity. The length of the time interval, during which the input current and the input voltage have the same polarity, may be compared with a second reference value, and the foreign object may exist between the transmission pad and the reception pad when the length of the time interval is less than the second reference value.

When the ZPA control is performed for the power transfer converter and the foreign object does not exist between the transmission pad and the reception pad, the length of the time interval during which the input current and the input voltage have different polarities may become a value of 0.

The at least one processor may be further configured to control the power transfer converter to make the WPT be stopped in response to determining that the foreign object exists between the transmission pad and the reception pad.

In accordance with another embodiment of the present disclosure, a wireless power transfer (WPT) apparatus may comprise: a power transfer converter included in or connected to a transmission pad for WPT, the power transfer converter converting an input voltage to an output voltage in an induction power transfer (IPT) manner, and outputting the output voltage; at least one processor; and a memory storing at least one instruction executed by the at least one processor. The at least one instruction may cause the at least one processor to perform a zero phase angle (ZPA) control for the power transfer converter; detect a phase difference between an input current and an input voltage of the power transfer converter; and determine whether or not a foreign object exists between the transmission pad and a reception pad for the WPT by comparing the phase difference with a reference value.

The phase difference may be obtained using a length of a time interval during which the input current and the input voltage have different polarities.

The length of the time interval, during which the input current and the input voltage have different polarities, may be compared with a first reference value, and the object may exist between the transmission pad and the reception pad when the length of the time interval exceeds the first reference value.

The phase difference may be obtained using a length of a time interval during which the input current and the input voltage have a same polarity.

The length of the time interval, during which the input current and the input voltage have the same polarity, may be compared with a second reference value, and the foreign object may exist between the transmission pad and the reception pad when the length of the time interval is less than the second reference value.

Using the foreign object detecting method, the WPT control apparatus, and the WPT apparatus according to the embodiments of the present disclosure as described above, it is made possible to detect a foreign object between the transmission and reception pads for WPT without adding any hardware. Further, a foreign object such as metal can be detected during operation of the WPT apparatus.

BRIEF DESCRIPTION OF DRAWINGS

Embodiments of the present disclosure will become more apparent by describing in detail embodiments of the present disclosure with reference to the accompanying drawings, in which.

Figure 1:
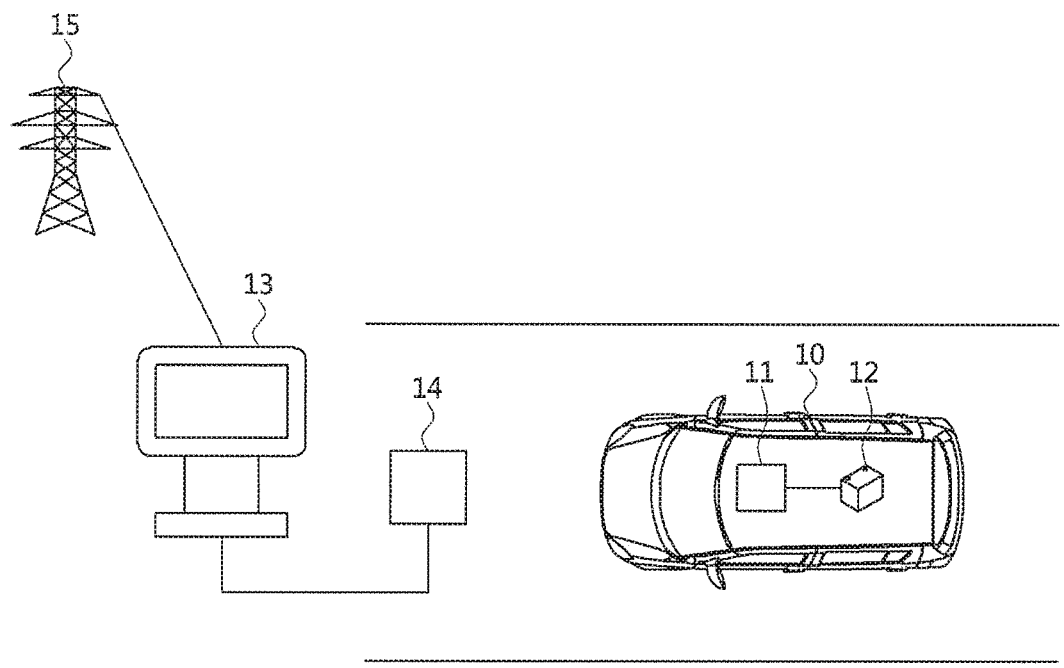
FIG. 1 is a conceptual diagram illustrating a concept of a wireless power transfer (WPT) to which embodiments of the present disclosure are applied.

It should be understood that the above-referenced drawings are not necessarily to scale, presenting a somewhat simplified representation of various preferred features illustrative of the basic principles of the disclosure. The specific design features of the present disclosure, including, for example, specific dimensions, orientations, locations, and shapes, will be determined in part by the particular intended application and use environment.

DETAILED DESCRIPTION OF THE EMBODIMENTS

Embodiments of the present disclosure are disclosed herein. Specific structural and functional details disclosed herein are merely representative for purposes of describing embodiments of the present disclosure, however, embodiments of the present disclosure may be embodied in many alternate forms and should not be construed as limited to embodiments of the present disclosure set forth herein. While describing the respective drawings, like reference numerals designate like elements.

It will be understood that although the terms "first," "second," etc. may be used herein to describe various components, these components should not be limited by these terms. These items are used merely to distinguish one element from another. For example, without departing from the scope of the present disclosure, a first component may be designated as a second component, and similarly, the second component may be designated as the first component. The term "and/or" include any and all combinations of one of the associated listed items.

It will be understood that when a component is referred to as being "connected to" another component, it can be directly or indirectly connected to the other component. That is, for example, intervening components may be present. On the contrary, when a component is referred to as being "directly connected to" another component, it will be understood that there is no intervening components.

Terms are used herein only to describe the embodiments but not to limit the present disclosure. Singular expressions, unless defined otherwise in contexts, include plural expressions. In the present specification, terms of "comprise" or "have" are used to designate features, numbers, steps, operations, elements, components or combinations thereof disclosed in the specification as being present but not to exclude possibility of the existence or the addition of one or more other features, numbers, steps, operations, elements, components, or combinations thereof.

All terms including technical or scientific terms, unless being defined otherwise, have the same meaning generally understood by a person of ordinary skill in the art. It will be understood that terms defined in dictionaries generally used are interpreted as including meanings identical to contextual meanings of the related art, unless definitely defined otherwise in the present specification, are not interpreted as being ideal or excessively formal meanings.

Terms used in the present disclosure are defined as follows.

"Electric Vehicle, EV": An automobile, as defined in 49 CFR 5233, intended for highway use, powered by an electric motor that draws current from an on-vehicle energy storage device, such as a battery, which is rechargeable from an off-vehicle source, such as residential or public electric service or an on-vehicle fuel powered generator. The EV may be four or more wheeled vehicle manufactured for use primarily on public streets, roads.

The EV may be referred to as an electric car, an electric automobile, an electric road vehicle (ERV), a plug-in vehicle (PV), a plug-in vehicle (xEV), etc., and the xEV may be classified into a plug-in all-electric vehicle (BEV), a battery electric vehicle, a plug-in electric vehicle (PEV), a hybrid electric vehicle (HEY), a hybrid plug-in electric vehicle (HPEV), a plug-in hybrid electric vehicle (PHEV), etc.

"Plug-in Electric Vehicle, PEV": An Electric Vehicle that recharges the on-vehicle primary battery by connecting to the power grid.

"Plug-in vehicle, PV": An electric vehicle rechargeable through wireless charging from an electric vehicle supply equipment (EVSE) without using a physical plug or a physical socket.

"Heavy duty vehicle; H.D. Vehicle": Any four-or more wheeled vehicle as defined in 49 CFR 523.6 or 49 CFR 37.3 (bus).

"Light duty plug-in electric vehicle": A three or four-wheeled vehicle propelled by an electric motor drawing current from a rechargeable storage battery or other energy devices for use primarily on public streets, roads and highways and rated at less than 4,545 kg gross vehicle weight.

"Wireless power charging system, WCS": The system for wireless power transfer and control between the GA and VA including alignment and communications. This system transfers energy from the electric supply network to the electric vehicle electromagnetically through a two-part loosely coupled transformer.

"Wireless power transfer, WPT": The transfer of electrical power from the AC supply network to the electric vehicle by contactless means.

"Utility": A set of systems which supply electrical energy and may include a customer information system (CIS), an advanced metering infrastructure (AMI), rates and revenue system, etc. The utility may provide the EV with energy through rates table and discrete events. Further, the utility may provide information about certification on EVs, interval of power consumption measurements, and tariff.

"Smart charging": A system in which EVSE and/or PEV communicate with power grid in order to optimize charging ratio or discharging ratio of EV by reflecting capacity of the power grid or expense of use.

"Automatic charging": A procedure in which inductive charging is automatically performed after a vehicle is located in a proper position corresponding to a primary charger assembly that can transfer power. The automatic charging may be performed after obtaining necessary authentication and right.

"Interoperability": A state in which components of a system interwork with corresponding components of the system in order to perform operations aimed by the system. Further, information interoperability may mean capability that two or more networks, systems, devices, applications, or components can efficiently share and easily use information without causing inconvenience to users.

"Inductive charging system": A system transferring energy from a power source to an EV through a two-part gapped core transformer in which the two halves of the transformer, primary and secondary coils, are physically separated from one another. In the present disclosure, the inductive charging system may correspond to an EV power transfer system.

"Inductive coupler": The transformer formed by the coil in the GA Coil and the coil in the VA Coil that allows power to be transferred with galvanic isolation.

"Inductive coupling": Magnetic coupling between two coils. In the present disclosure, coupling between the GA Coil and the VA Coil.

"Ground assembly, GA'": An assembly on the infrastructure side consisting of the GA Coil, a power/frequency conversion unit and GA controller as well as the wiring from the grid and between each unit, filtering circuits, housing(s) etc., necessary to function as the power source of wireless power charging system. The GA may include the communication elements necessary for communication between the GA and the VA.

"Vehicle assembly, VA": An assembly on the vehicle consisting of the VA Coil, rectifier/power conversion unit and VA controller as well as the wiring to the vehicle batteries and between each unit, filtering circuits, housing(s), etc., necessary to function s the vehicle part of a wireless power charging system. The VA may include the communication elements necessary for communication between the VA and the GA.

The GA may be referred to as a primary device (PD), and the VA may be referred to as a secondary device (SD).

"Primary device": An apparatus which provides the contactless coupling to the secondary device. That is, the primary device may be an apparatus external to an EV. When the EV is receiving power, the primary device may act as the source of the power to be transferred. The primary device may include the housing and all covers.

"Secondary device": An apparatus mounted on the EV which provides the contactless coupling to the primary device. That is, the secondary device may be installed in the EV When the EV is receiving power, the secondary device may transfer the power from the primary to the EV. The secondary device may include the housing and all covers.

"GA controller": The portion of the GA which regulates the output power level to the GA Coil based on information from the vehicle.

"VA controller": The portion of the VA that monitors specific on-vehicle parameters during charging and initiates communication with the GA to control output power level.

The GA controller may be referred to as a primary device communication controller (PDCC), and the VA controller may be referred to as an electric vehicle communication controller (EVCC).

"Magnetic gap": The vertical distance between the plane of the higher of the top of the litz wire or the top of the magnetic material in the GA Coil to the plane of the lower of the bottom of the litz wire or the magnetic material in the VA Coil when aligned.

"Ambient temperature": The ground-level temperature of the air measured at the subsystem under consideration and not in direct sun light.

"Vehicle ground clearance": The vertical distance between the ground surface and the lowest part of the vehicle floor pan.

"Vehicle magnetic ground clearance": The vertical distance between the plane of the lower of the bottom of the litz wire or the magnetic material in the VA Coil mounted on a vehicle to the ground surface.

"VA Coil magnetic surface distance": the distance between the plane of the nearest magnetic or conducting component surface to the lower exterior surface of the VA coil when mounted. This distance includes any protective coverings and additional items that may be packaged in the VA Coil enclosure.

The VA coil may be referred to as a secondary coil, a vehicle coil, or a receive coil. Similarly, the GA coil may be referred to as a primary coil, or a transmit coil.

"Exposed conductive component": A conductive component of electrical equipment (e.g. an electric vehicle) that may be touched and which is not normally energized but which may become energized in case of a fault.

"Hazardous live component": A live component, which under certain conditions can give a harmful electric shock.

"Live component": Any conductor or conductive component intended to be electrically energized in normal use.

"Direct contact": Contact of persons with live components. (See IEC 61440)

"Indirect contact": Contact of persons with exposed, conductive, and energized components made live by an insulation failure. (See IEC 61140)

"Alignment": A process of finding the relative position of primary device to secondary device and/or finding the relative position of secondary device to primary device for the efficient power transfer that is specified. In the present disclosure, the alignment may direct to a fine positioning of the wireless power transfer system. "Pairing": A process by which a vehicle is correlated with the unique dedicated primary device, at which it is located and from which the power will be transferred. Pairing may include the process by which a VA controller and a GA controller of a charging spot are correlated. The correlation/association process may include the process of establishment of a relationship between two peer communication entities.

"Command and control communication": The communication between the EV supply equipment and the EV exchanges information necessary to start, control and terminate the process of WPT.

"High level communication (HLC)": HLC is a special kind of digital communication. HLC is necessary for additional services which are not covered by command & control communication. The data link of the HLC may use a power line communication (PLC), but it is not limited.

"Low power excitation (LPE)": LPE means a technique of activating the primary device for the fine positioning and pairing so that the EV can detect the primary device, and vice versa.

"Service set identifier (SSID)": SSID is a unique identifier consisting of 32-characters attached to a header of a packet transmitted on a wireless LAN. The SSID identifies the basic service set (BSS) to which the wireless device attempts to connect. The SSID distinguishes multiple wireless LANs. Therefore, all access points (APs) and all terminal/station devices that want to use a specific wireless LAN can use the same SSID. Devices that do not use a unique SSID are not able to join the BSS. Since the SSID is shown as plain text, it may not provide any security features to the network.

"Extended service set identifier (ESSID)": ESSID is the name of the network to which one desires to connect. It is similar to SSID but can be a more extended concept.

"Basic service set identifier (BSSID)": BSSID consisting of 48 bits is used to distinguish a specific BSS. In the case of an infrastructure BSS network, the BSSID may be medium access control (MAC) of the AP equipment. For an independent BSS or ad hoc network, the BSSID can be generated with any value.

The charging station may comprise at least one GA and at least one GA controller configured to manage the at least one GA. The GA may comprise at least one wireless communication device. The charging station may mean a place having at least one GA, which is installed home, office, public place, road, parking area, etc.

Additionally, it is understood that one or more of the below methods, or aspects thereof, may be executed by at least one controller. The term "controller" may refer to a hardware device that includes a memory and a processor. The memory is configured to store program instructions, and the processor is specifically programmed to execute the program instructions to perform one or more processes which are described further below. Moreover, it is understood that the below methods may be executed by an apparatus comprising the controller in conjunction with one or more other components, as would be appreciated by a person of ordinary skill in the art.

In embodiments according to the present disclosure, a light load driving or light load operation may include, for example, charging a high voltage battery with a charging voltage lower than a predetermined rated voltage in the latter half of charging for the high voltage battery connected to the VA in the WPT system. Also, the light load operation may include a case in which the high-voltage battery of EV is charged at a relatively low voltage and at a low speed by using a low-speed charger such as a household charger.

Hereinafter, embodiments according to the present disclosure will be explained in detail by referring to accompanying figures.

FIG. 1 is a conceptual diagram illustrating a concept of a wireless power transfer (WPT) to which embodiments of the present disclosure are applied.

Referring to FIG. 1, a WPT may be performed by at least one component of an electric vehicle (EV) 10 and a charging station 13, and may be used for wirelessly transferring power to the EV 10.

Here, the EV 10 may be defined as a vehicle supplying an electric power stored in a rechargeable energy storage including a battery 12 as an energy source of an electric which is a power train system of the EV 10.

However, the EV 10 according to an embodiment of the present disclosure may include a hybrid electric vehicle (HEV) having an electric motor and an internal combustion engine together, and may include not only an automobile but also a motorcycle, a cart, a scooter, and an electric bicycle.

The EV 10 may include a power reception pad 11 including a reception coil for charging the battery 12 wirelessly and may include a plug connection for conductively charging the battery 12. Here, the EV 10 configured for conductively charging the battery may be referred to as a plug-in electric vehicle (PEV).

Here, the charging station 13 may be connected to a power grid 15 or a power backbone, and may provide an alternating current (AC) power or a direct current (DC) power to a power transmission pad 14 including a transmission coil through a power link.

The charging station 13 may communicate with an infrastructure management system or an infrastructure server that manages the power grid 15 or a power network through wired/wireless communications, and performs wireless communications with the EV 10.

Here, the wireless communications may be Bluetooth, Zigbee, cellular, wireless local area network (WLAN), or the like.

For example, the charging station 13 may be located at various places including a parking area attached to the owner's house of the EV 10, a parking area for charging an EV at a gas station, a parking area at a shopping center or a workplace.

A process of wirelessly charging the battery 12 of the EV 10 may begin with first placing the power reception pad 11 of the EV 10 in an energy field generated by the power transmission pad 14 of the charging station 13, and making the reception coil and the transmission coil be interacted or coupled with each other. An electromotive force may be induced in the power reception pad 11 as a result of the interaction or coupling, and the battery 12 may be charged by the induced electromotive force.

The charging station 13 and the transmission pad 14 may be referred to as a ground assembly (GA) in whole or in part, where the GA may refer to the previously defined meaning.

All or part of the internal components and the reception pad 11 of the EV 10 may be referred to as a vehicle assembly (VA), in which the VA may refer to the previously defined meaning.

Here, the power transmission pad 14 or the power reception pad 11 may be configured to be non-polarized or polarized.

In a case that a pad is non-polarized, there is one pole in a center of the pad and an opposite pole in an external periphery. Here, a flux may be formed to exit from the center of the pad and return at all to external boundaries of the pad.

In a case that a pad is polarized, it may have a respective pole at either end portion of the pad. Here, a magnetic flux may be formed based on an orientation of the pad.

Figure 2:
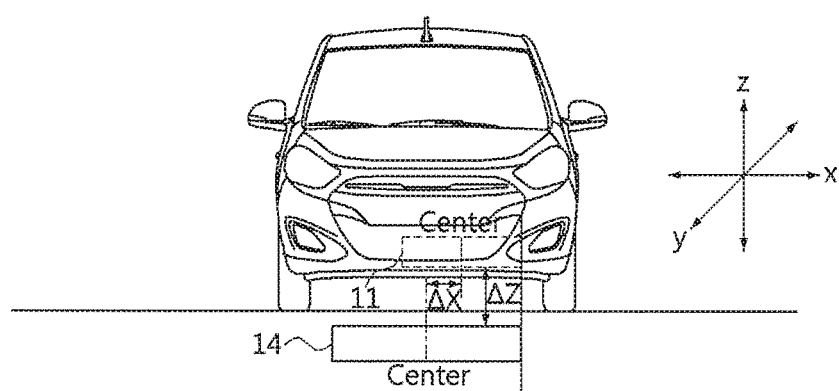
FIG. 2 is a conceptual diagram for explaining a concept of alignment in an EV WPT according to embodiments of the present disclosure.

FIG. 2 is a conceptual diagram for explaining a concept of alignment in an EV WPT according to embodiments of the present disclosure.

Referring to FIG. 2, a method of aligning the power transmission pad 14 and the power reception pad 11 in the EV in FIG. 1 will be described. Here, a positional alignment may correspond to the alignment, which is the above-mentioned term, and thus may be defined as a positional alignment between the GA and the VA, but is not limited to the alignment of the transmission pad and the reception pad.

Although the transmission pad 14 is illustrated as positioned below a ground surface as shown in FIG. 2, the transmission pad 14 may also be positioned on the ground surface, or positioned such that a top portion surface of the transmission pad 14 is exposed below the around surface.

The reception pad 11 of the EV may be defined by different categories according to its heights (defined in the z direction) measured from the ground surface. For example, a class 1 for reception pads having a height of 100-150 millimeters (mm) from the ground surface, a class 2 for reception pads having a height of 140-210 mm, and a class 3 for reception pads having a height of 170-250 mm may be defined. Here, the reception pad may support a part of the above-described classes 1 to 3. For example, only the class 1 may be supported according to the type of the reception pad 11, or the class 1 and 2 may be supported according to the type of the reception pad 11.

Here, the height of the reception pad measured from the ground surface may correspond to the previously defined term 'vehicle magnetic ground clearance'.

Further, the position of the power transmission pad 14 in the height direction (i.e., defined in the z direction) may be determined to be located between the maximum class and the minimum class supported by the power reception pad 11. For example, when the reception pad supports only the class 1 and 2, the position of the power transmission pad 14 may be determined between 100 and 210 mm with respect to the power reception pad 11.

Still further, a gap between the center of the power transmission pad 14 and the center of the power reception pad 11 may be determined to be located within the limits of the horizontal and vertical directions (defined in the x and y directions). For example, it may be determined to be located within ±75 mm in the horizontal direction (defined in the x direction), and within ±100 mm in the vertical direction (defined in the y direction).

Here, the relative positions of the power transmission pad 14 and the power reception pad 11 may be varied in accordance with their experimental results, and the numerical values should be understood as exemplary.

Figure 3:
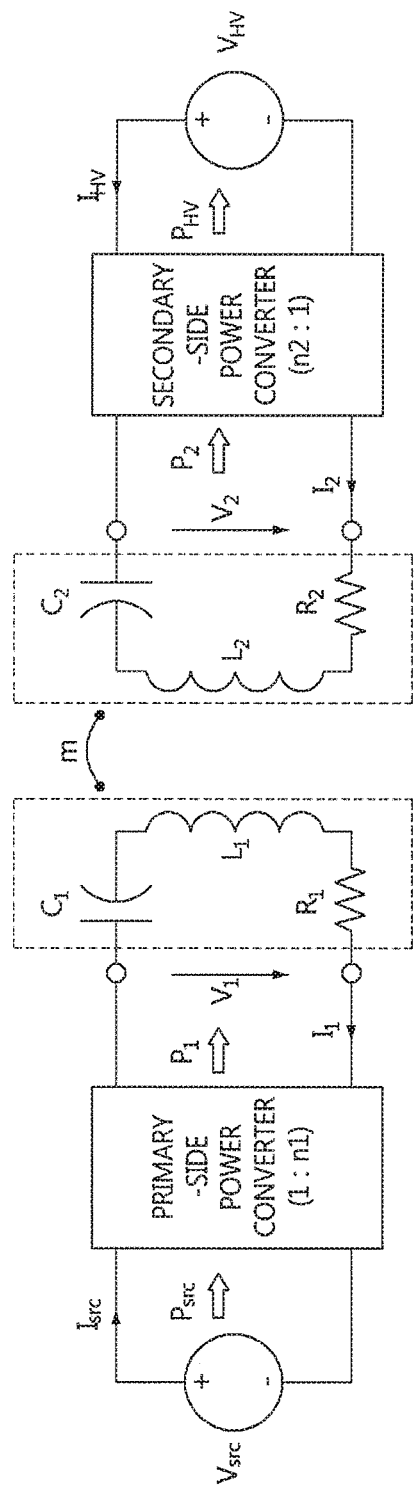
FIG. 3 is a conceptual diagram illustrating a WPT circuit according to embodiments of the present disclosure.

FIG. 3 is a conceptual diagram illustrating a WPT circuit according to embodiments of the present disclosure.

Referring to FIG. 3, a schematic configuration of a circuit in which a WPT is performed in an EV WPT system may be seen.

Here, the left side of FIG. 3 may be interpreted as expressing all or part of a power source $V_{STC}$ supplied from the power network, the charging station 13, and the transmission pad 14 in FIG. 1, and the right side of FIG. 3 may be interpreted as expressing all or part of the EV including the reception pad and the battery.

First, the left side circuit of FIG. 3 may provide an output power $P_{STC}$ corresponding to the power source $V_{STC}$ supplied from the power network to a primary-side power converter. The primary-side power converter may supply an output power $P_1$ converted from the output power $P_{STC}$ through frequency-converting and AC-to-DC/DC-to-AC converting to generate an electromagnetic field at a desired operating frequency in a transmission coil $L_1$.

Specifically, the primary-side power converter may include an AC/DC converter for converting the power $P_{STC}$ which is an AC power supplied from the power network into a DC power, and a low frequency (U) converter for converting the DC power into an AC power having an operating frequency suitable for wireless charging. For example, the operating frequency for wireless charging may be determined to be within 80 to 90 kHz.

The power $P_1$ output from the primary-side power converter may be supplied again to a circuit including the transmission coil $L_1$, a first capacitor $C_1$ and a first resistor $R_1$. Here, a capacitance of the first capacitor $C_1$ may be determined as a value to have an operating frequency suitable for charging together with the transmission coil $L_1$. Here, the first resistor $R_1$ may represent a power loss occurred by the transmission coil $L_1$ and the first capacitor $C_1$.

Further, the transmission coil $L_1$ may be made to have electromagnetic coupling, which is defined by a coupling coefficient m, with the reception coil $L_2$ so that a power $P_2$ is transmitted, or the power $P_2$ is induced in the reception coil $L_2$. Therefore, the meaning of power transfer in the present disclosure may be used together with the meaning of power induction.

Still further, the power $P_2$ induced in or transferred to the reception coil $L_2$ may be provided to a secondary-side power converter. Here, a capacitance of a second capacitor $C_2$ may be determined as a value to have an operating frequency suitable for wireless charging together with the reception coil $L_2$, and a second resistor $R_2$ may represent a power loss occurred by the reception coil $L_2$ and the second capacitor $C_2$.

The secondary-side power converter may include an LF-to-DC converter that converts the supplied power $P_2$ of a specific operating frequency to a DC power having a voltage level suitable for the battery $V_{HV}$ of the EV.

The electric power $P_{HV}$ converted from the power $P_2$ supplied to the secondary-side power converter may be output, and the power $P_{HV}$ may be used for charging the battery $V_{HV}$, disposed in the EV.

Here, the right side circuit of FIG. 3 may further include a switch for selectively connecting or disconnecting the reception coil $L_2$ with the battery $V_{HV}$. Here, resonance frequencies of the transmission coil $L_1$ and the reception coil $L_2$ may be similar or identical to each other, and the reception coil $L_2$ may be positioned near the electromagnetic field generated by the transmission coil $L_1$.

Here, the circuit of FIG. 3 should be understood as an illustrative circuit for WPT in the EV WPT system used for embodiments of the present disclosure, and is not limited to the circuit illustrated in FIG. 3.

On the other hand, since the power loss may increase as the transmission coil $L_1$ and the reception coil $L_2$ are located at a long distance, it may be an important factor to properly set the relative positions of the transmission coil $L_1$ and the reception coil $L_2$.

Here, the transmission coil $L_1$ may be included in the transmission pad 14 in FIG. 1, and the reception coil $L_2$ may be included in the reception pad 1*l* in FIG. 1. Therefore, positioning between the transmission pad and the reception pad or positioning between the EV and the transmission pad will be described below with reference to the drawings.

Figure 4:
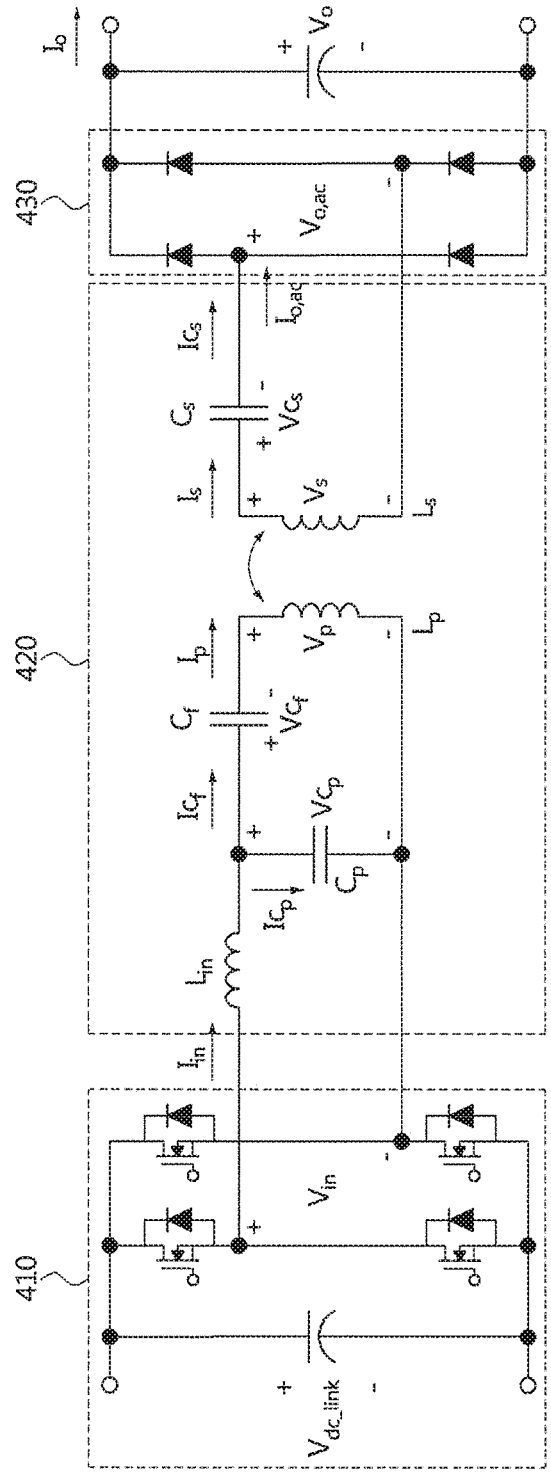
FIG. 4 is a detailed circuit diagram illustrating an inductive power transfer (IPT) converter to which embodiments of the present disclosure are applied.

FIG. 4 is a detailed circuit diagram illustrating an inductive power transfer (IPT) converter to which embodiments of the present disclosure are applied.

The IPT converter illustrated in FIG. 4 may be an LCCL-S type converter circuit, and may be an example of various power transfer converter circuits to which embodiments of the present disclosure may be applied.

The IPT converter illustrated in FIG. 4 may be mainly configured to comprise an AC inverter 410, a resonant tank 420, and a rectifier bridge 430. The IPT converter may convert an input voltage $V_{in}$ to an output voltage $V_0$ in an IPT manner, transfer the output voltage $V_0$ to a battery, and perform constant current/constant voltage charging to the battery under a zero phase angle (ZPA) condition.

The AC inverter 410 may be a circuit including four switches. The AC inverter 410 may convert an input voltage $V_{dc\_link}$ in a DC form into a voltage $V_{in}$ in an AC form according to switching operations of the first to fourth switches, and transfer the converted AC voltage to the resonant tank 420.

The resonant tank 420 may be divided into a primary resonant tank and a secondary resonant tank. The primary resonant tank may be connected to the AC inverter 410 and the secondary resonant tank may be connected to the rectifier bridge 430 to perform the voltage conversion through IPT between the primary resonant tank and the secondary resonant tank.

Specifically, the primary resonant tank may comprise a primary resonant inductor $L_{in}$ and primary resonant capacitors $C_f$ and $C_p$. Here, the resonant capacitors $C_f$ and $C_p$ may be connected to a primary coil $L_p$ in series with each other. The primary resonant tank may be implemented on input voltage lines connecting a pair of legs constituting the AC inverter 410. That is, the primary resonant inductor $L_{in}$ and one end of the resonant capacitor $C_p$ may be connected to the AC inverter 410.

The secondary resonant tank may comprise a secondary resonant capacitor $C_s$ and may be connected to a secondary coil $L_s$. The secondary resonant tank may be implemented on output voltage lines connecting a pair of legs constituting the rectifier bridge 430.

In order to minimize a voltage-current (VA) rating of the IPT converter circuit illustrated in FIG. 4, it is necessary to perform a ZPA control so that the input voltage $V_{in}$ and an input current $I_{in}$ are in-phase.

Figure 5:
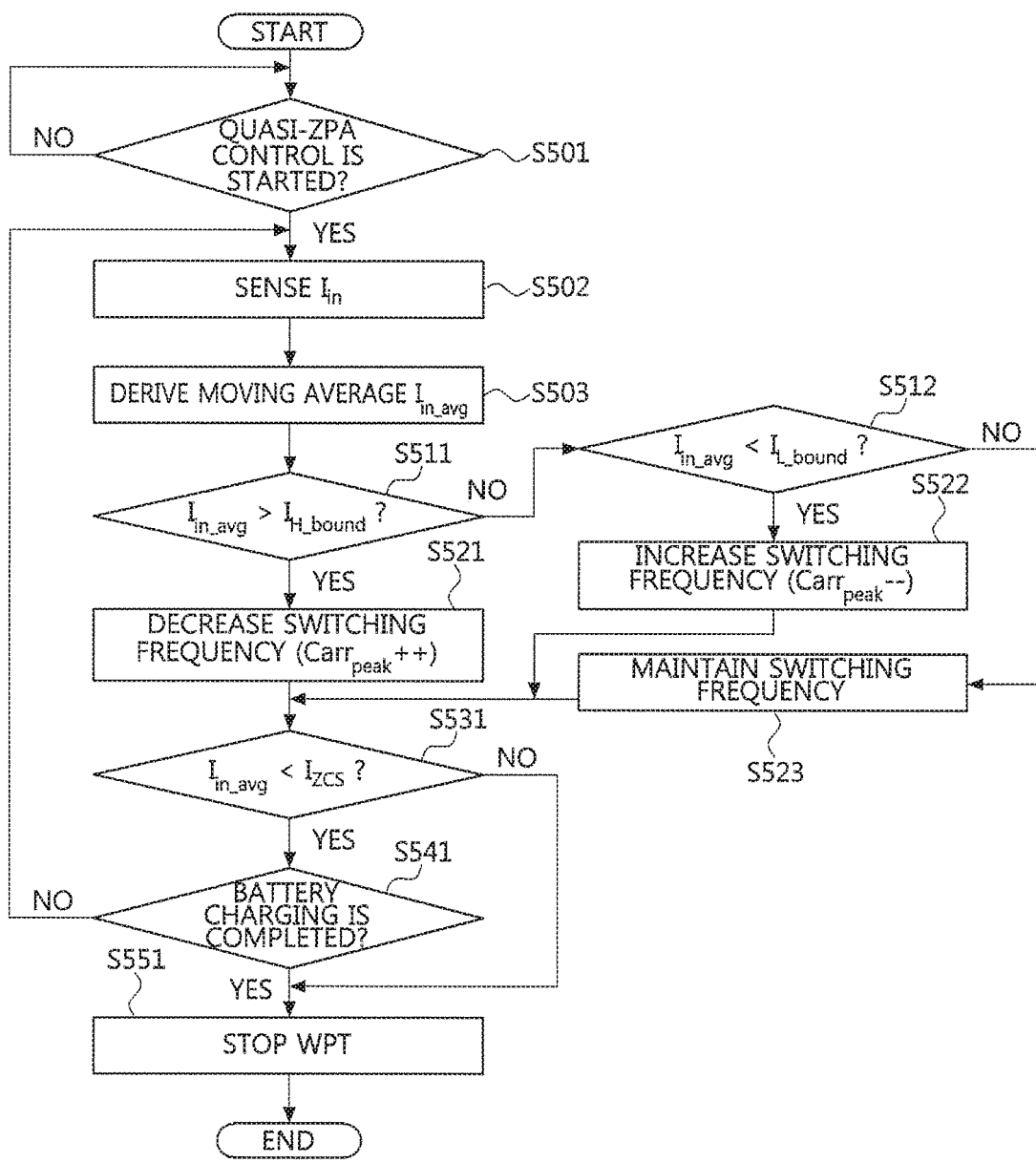
FIG. 5 is a flowchart for explaining a quasi-LPA control method of an IPT converter.

FIG. 5 is a flowchart for explaining a quasi-ZPA control method of an IPT converter.

Referring to FIG. 5, when a quasi-ZPA is started (S501), the input current $I_{in}$ of the IPT converter may be sensed (S502). The sensing of the input current may be continuously performed over time, thereby deriving a moving average $I_{in\_avg}$ of the input current (S503).

When the moving average $I_{in\_avg}$ of the input current is derived, a switching frequency may be adjusted by comparing the moving average with an upper limit value and a lower limit value of the input current. More specifically, when the moving average $I_{in\_avg}$ of the input current exceeds the upper limit value $I_{H\_bound}$ (S511), the switching frequency f may be decreased (S521). Here, decreasing the switching frequency may mean increasing a peak value $Carr_{peak}$ of a carrier signal in a form of sawtooth. In the IPT converter illustrated in FIG. 4, gate signals for the switches may be generated in a digital processor (DSP) by comparing the sawtooth wave a wave of the carrier signal) with a reference wave, and a maximum value of the sawtooth wave may be expressed by $Carr_{peak}$.

On the other hand, when the moving average $I_{in\_avg}$ of the input current is less than the lower limit value $I_{L\_bounds}$ the switching frequency may be increased (S522). Here, increasing h switching frequency may mean decreasing the peak value $Carr_{peak}$ of the carrier signal in the form of sawtooth.

If the moving average $I_{in\_avg}$ of the input current does not exceed the upper limit value $I_{H\_bound}$ and is not less than the lower limit value $I_{L\_bounds}$ that is, if the moving average of the input current is between the upper limit value and the lower limit value, the switching frequency f may be maintained (S523).

When the above-described frequency adjustment procedure is completed, it may be determined whether the current moving average $I_{in\_avg}$ is less than the $I_{ZCS}$ (S531). If the current moving average $I_{in\_avg}$ is less than $I_{ZCS}$, it may be checked whether the battery charging is completed (S541), and the above-described steps (S502 to S541) may be repeatedly performed until the battery charging is completed. When the battery charging is completed, the WPT may be stopped (S551).

On the other hand, if the current moving average $I_{in\_avg}$ is equal to or higher than the $I_{ZCS}$ after the frequency adjustment procedure is completed, the WPT may be stopped (S55I). Here, $I_{ZCS}$ may mean a current value of a current sensing point at which a zero current switching (ZCS) operation is performed. A zero voltage switching (ZVS, current phase lagging) and a zero current switching (ZCS, current phase leading) may occur according to a phase difference between the input voltage $V_{in}$ and the input current $I_{in}$ which is a resonant current. In order for the WPT system to operate normally, the ZVS operation should be performed. When the magnitude of at the current sensing point is larger than 0, it may mean that the ZCS operation is being performed, and thus the WPT may be stopped. The $I_{ZCS}$ may have a preset threshold, for example, a value of 1 A.

In the case of the conventional ZPA control explained with reference to FIG. 5, phases of the input voltage and the input current are detected, and the ZPA operation is performed through the variable control on the switching frequency. When the IPT converter reaches a steady state, the switching frequency may be fixed at a constant value, and a frequency fluctuation width due to factors such as load variation is small.

Figure 6A:
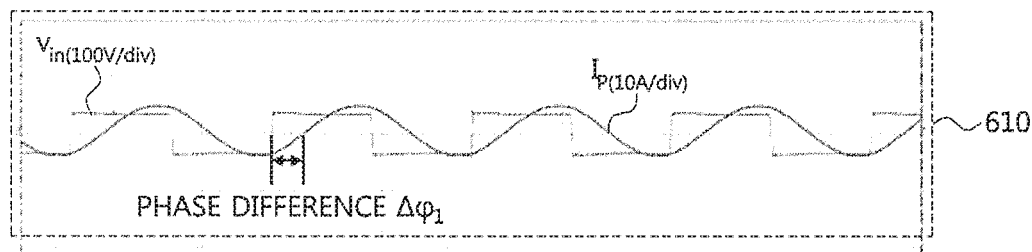
FIG. 6A is a graph illustrating waveforms of an input current and an input voltage in an IPT converter in a normal case.
Figure 6B:
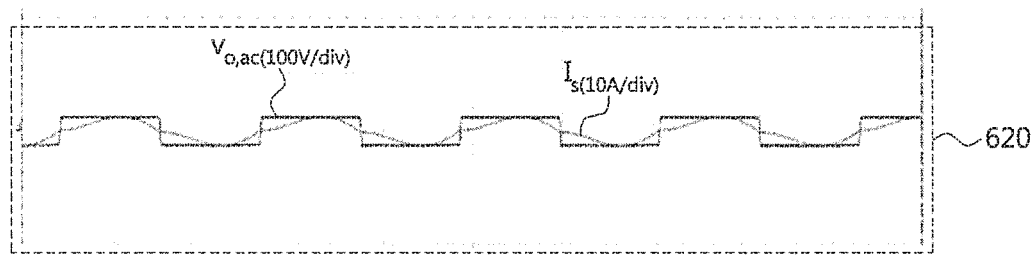
FIG. 6B is a graph illustrating waveforms of an output voltage and a current induced at a secondary coil in the normal case.

FIG. 6A is a graph illustrating waveforms of an input current and an input voltage on an IPT converter in a normal case, and FIG. 6B is a graph illustrating waveforms of an output voltage and a current induced at a secondary coil in the normal case.

FIG. 6A illustrates a relation between the input voltage $V_{in}$ of the IPT converter and the resonant current $I_p$ of the primary coil in the primary resonant tank in a normal case. A pulse-shaped signal represents the input voltage $V_{in}$, and a sinusoidal wave signal represents the resonant current $I_p$. Here, the normal case may mean that no foreign object is interposed between the transmission coil and the reception coil.

Referring to FIG. 6A, it may be seen that a phase difference occurs between the input voltage $V_{in}$ and the resonant current $I_p$. That is, the input voltage and the resonant current illustrated in FIG. 6A indicate the input voltage and the resonant current for the IPT converter in which the ZPA control is not completely performed. If the ZPA control is performed under the condition that no foreign object exists between the transmission coil and the reception coil, the phase difference between the input voltage and the resonant current may not occur.

FIG. 6B illustrates a relation between the output voltage $V_{o,ac}$ and a current $I_s$ induced at the secondary coil in the normal case.

Figure 7A:
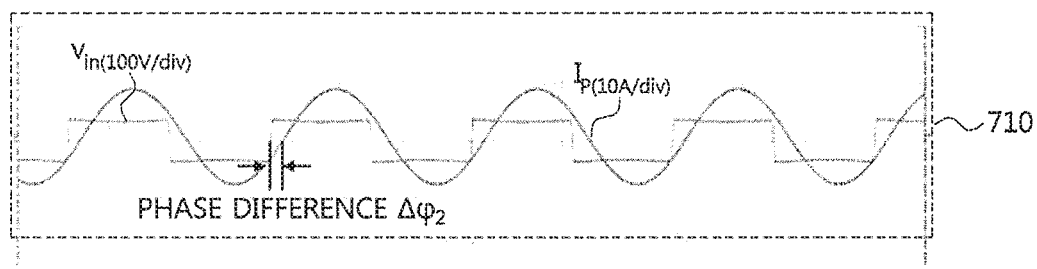
FIG. 7A is a graph illustrating waveforms of an input current and an input voltage for an IPT converter in a case that a foreign object exists.
Figure 7B:
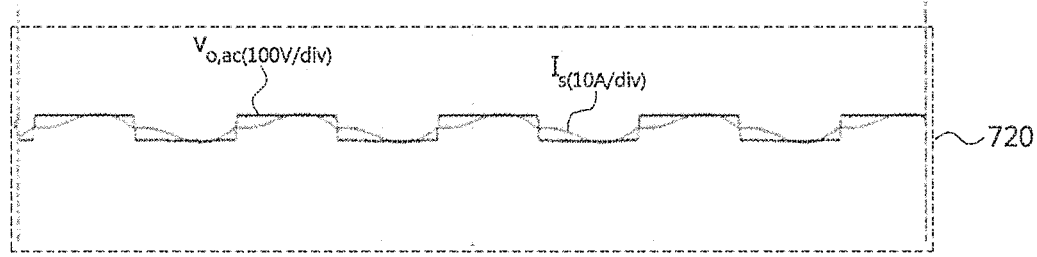
FIG. 7B is a graph illustrating waveforms of an output voltage and a current induced at a secondary coil in the case that a foreign object exists.

FIG. 7A is a graph illustrating waveforms of an input current and an input voltage for an IPT converter in a case that a foreign object exists, and FIG. 7B is a graph illustrating waveforms of an output voltage and a current induced at a secondary coil in the case that a foreign object exists.

The graph illustrated in FIG. 7A is a graph in comparison with FIG. 6A, which illustrates a relation between the input voltage and the output voltage in the presence of a foreign object that may affect a magnetic field, such as metal or magnetic material, between the transmission coil and the reception coil.

FIG. 7A illustrates the relation between the input voltage $V_{in}$ the IPT converter and the resonant current $I_p$ of the primary coil of the resonant tank when the foreign object is intervened. A pulse-shaped signal represents the input voltage $V_{in}$, and a sinusoidal wave signal represents the resonant current $I_p$. FIG. 7B shows the relation between the output voltage $V_{o,ac}$ and the current $I_s$ induced at in the secondary coil when the foreign object intervenes.

It may be seen that a phase difference $\Delta\varphi_2$ between the input voltage $V_{in}$ and the resonant current $I_p$ is different from the phase difference $\Delta\varphi_1$ between the input voltage and the resonant current in the normal case. That is, when the graph of FIG. 6A and the graph of FIG. 7A are compared, it may be seen that the phase difference between the input voltage and the resonant current has changed due to the foreign object interposed between the transmission coil and the reception coil.

That is, when a foreign object exists between the transmission and reception coils, magnetic fluxes may change and parameter values of the resonant network between the coils may also change. The degree of change may be different depending on various variables such as physical properties and size of the foreign object. Accordingly, when the foreign object enters between the transmission and reception coils during the normal operation of the IPT converter, a phase difference between the input voltage and the input current of the transmission-side resonant network may be changed.

In this case, the phases of the input voltage and the input current may be matched by controlling the switching frequency according to the changed current phase through the ZPA control.

Figure 8:
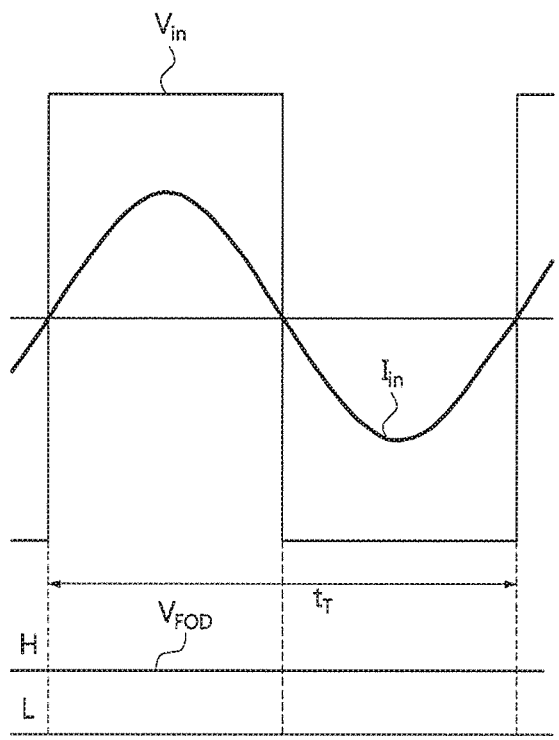
FIG. 8 is a graph illustrating a relation between an input voltage and an input current of an IPT converter in a normal case.

FIG. 8 is a graph illustrating a relation between an input voltage and an input current of an IPT converter in a normal case.

In the graph of FIG. 8, $t_T$ represents a signal period, the input voltage $V_{in}$ is a pulse-shaped signal, and the input current $I_{in}$ is a sinusoidal wave signal. As shown in FIG. 8, it may be seen that the input voltage and the input current are completely in-phase under an ideal condition where a foreign object does not exist.

A $V_{FOD}$ signal shown in the lower part of FIG. 8 has a value of 'high (H)' or 'low (L)' as a value indicating a result of comparing a polarity of the input voltage with a polarity of the input current, that is, a value obtained through an AND gate operation on the polarities. Under the ideal condition, the $V_{FOD}$ signal always has a 'high (H)' because the input voltage and the input current are in-phase and have the same polarity, so that the AND operation on polarities of them is always a logical value of '1'.

Figure 9:
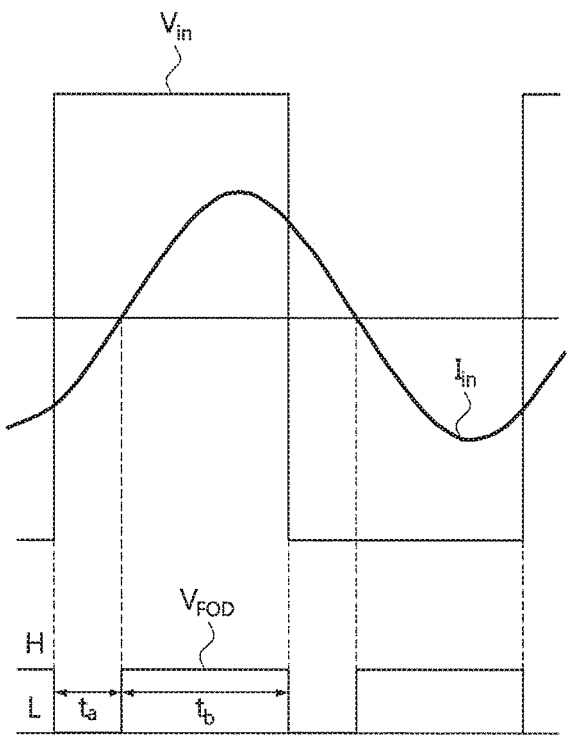
FIG. 9 is a graph illustrating a relation between an input voltage and an input current of an IPT converter in a case that a foreign object exists.

FIG. 9 is a graph illustrating a relation between an input voltage and an input current of an IPT converter in a case that a foreign object exists.

In the graph of FIG. 9, $t_T$ represents a signal period, the input voltage $V_{in}$ is a pulse-shaped signal, and the input current $I_{in}$ is a sinusoidal wave signal. It may be seen that the input voltage and the input current shown in FIG. 9 are not perfectly in-phase, which is a result of the foreign object intervening between the transmission and reception coils.

That is, a phase difference during a time interval $t_a$ is generated between the input voltage $V_{in}$ and the input current $I_{in}$. The input current and the input voltage have different polarities in the time interval of $t_a$, and the input current and the input voltage have the same polarity only in a time interval $t_b$, which is the time interval excluding the time interval $t_a$ from the entire period (i.e., $t_a+t_b$).

Thus, a result of comparing the polarity of the input voltage with the polarity of the input current, that is, a value obtained through an AND gate operation on the polarities may be 'low (L)' during the time interval $t_a$ and 'high (H)' during the time interval $t_b$, as shown in the lower part of FIG. 9.

In embodiments of the present disclosure, a foreign object may be detected by using a phase difference between the input current and the input voltage which occurs when a foreign object exists.

Figure 10:
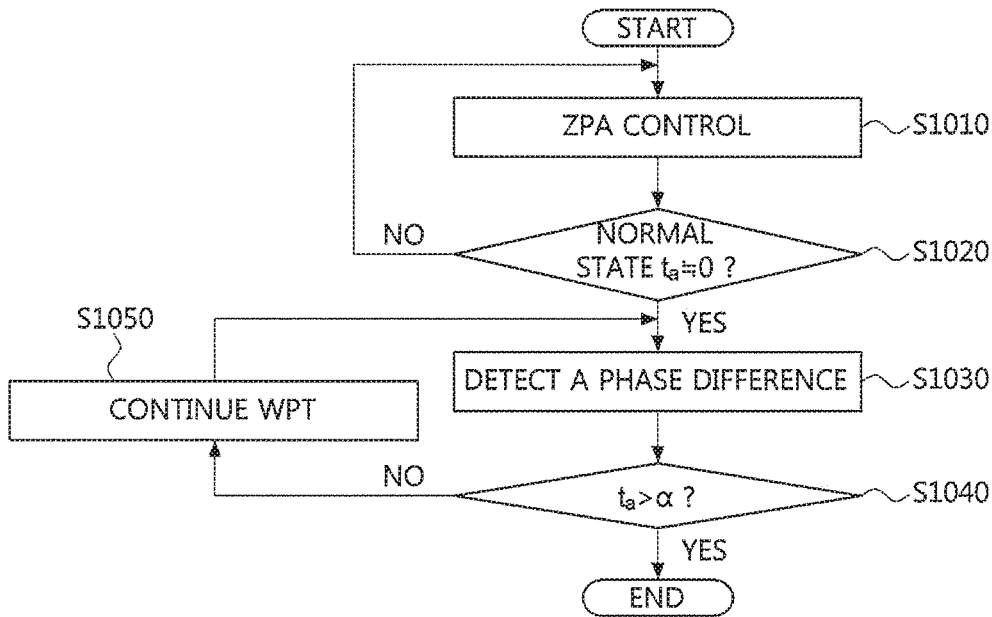
FIG. 10 is a flow chart for explaining a method of detecting a foreign object between a transmission coil and a reception coil according to an embodiment of the present disclosure.

FIG. 10 is a flow chart for explaining a method of detecting a foreign object between a transmission coil and a reception coil according to an embodiment of the present disclosure.

The foreign object detection method explained with reference FIG. 10 may be performed by a WPT control apparatus according to the present disclosure, but an entity performing the method is not limited to the WPT control apparatus.

In the present embodiment, a ZPA control is performed (S1010), and a normal state may be initially set through the ZPA control (S1020). Here, the normal state according to the present embodiment may mean a state in which a phase difference between the input current and the input voltage has a value of zero or a value close to zero, as shown in the graph of FIG. 9. That is, the normal state may also mean a state in which the length of the interval $t_a$ has a value of zero or a value close to zero.

Thereafter, the phase difference between the input current and the input voltage may be detected in real time to perform foreign object detection (FOD) (S1030). Here, the input current and the input voltage are the input current and the input voltage applied to the transmission pad.

The detected phase difference $t_a$ may be compared with a threshold value $\alpha$ that is a predetermined time value (S1040). If the phase difference $t_a$ exceeds the threshold value $\alpha$, it may be determined that a foreign object exists between the transmission coil and the reception coil, and the WPT may be stopped. On the other hand, if the phase difference $t_a$ is less than or equal to the threshold value $\alpha$, it may be determined that a foreign object does not exist between the transmission coil and the reception coil, and the WPT may be continued (S1050).

The graph of FIG. 9 shows that the interval when the polarities of the input current and the input voltage are different from each other is $t_a$ (i.e., the interval when the $V_{FOD}$ obtained by an AND operation on the polarities of them is 'low (L)'). Thus, when the ZPA control is ideally performed, $t_a$ has a value of zero or a value close to zero, and when a phase difference is caused by the foreign object, $t_a$ has a value exceeding the threshold value.

In summary, if the value of $t_a$ is greater than the predetermined time value after IPT converter according to the present disclosure reaches the normal state, it may be determined that a foreign object exists between the transmission coil and the reception coil, and the WPT may be stopped.

Figure 11:
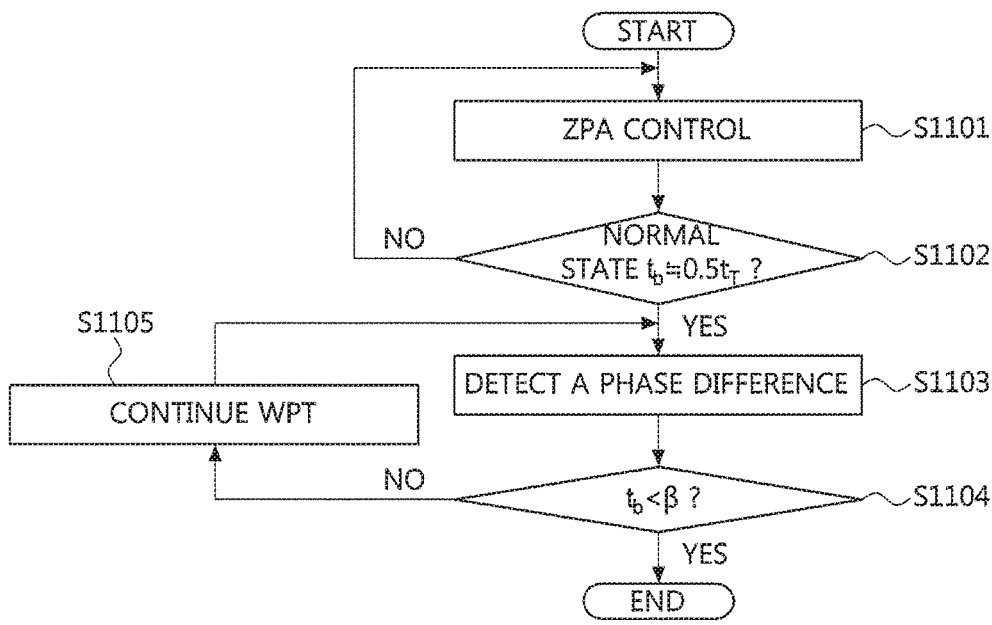
FIG. 11 is a flow chart for explaining a method of detecting a foreign object between a transmission coil and a reception coil according to another embodiment of the present disclosure.

FIG. 11 is a flow chart for explaining a method of detecting a foreign object between a transmission coil and a reception coil according to another embodiment of the present disclosure.

Also in the present embodiment, a ZPA control is performed (S1101), and a normal state may be initially set through the ZPA control (S1102). Here, the normal state according to the present embodiment may mean a state in which the interval $t_b$ is equal to or close to a half of $t_T$ (i.e., $0.5 \times t_T$).

Thereafter, the phase difference between the input current and the input voltage may be detected in real time to perform foreign object detection (FOD) (S1103). Here, the input current and the input voltage are the input current and the input voltage applied to the transmission pad.

The interval $t_b$ may be compared with a threshold value $\beta$ that is a predetermined time value (S1104). If $t_b$ is less than the threshold value $\beta$ it may be determined that a foreign object exists between the transmission coil and the reception coil, and the WPT may be stopped. On the other hand, when the interval $t_b$ is equal to or greater than the threshold value $\beta$, it may be determined that a foreign object does not exist between the transmission coil and the reception coil, and the WPT may be continued (S1105).

The graph of FIG. 9 shows that the interval when the polarities of the input current and the input voltage are the same is $t_b$ (i.e., the interval when the $V_{FOD}$ obtained by an AND operation on the polarities of them is 'high (H)'). Thus, when the ZPA control is ideally performed, $t_b$ has a value of $0.5 \times t_T$ or a value close to $0.5 \times t_T$, and when a phase difference is caused by the foreign object, $t_b$ has a value much less than $0.5 \times t_T$.

In summary, if the value of $t_b$ is less than the predetermined time value (e.g., $0.5 \times t_T$) after the IPT converter according to the present disclosure reaches the normal state, it may be determined that a foreign object exists between the transmission coil and the reception coil, and the WPT may be stopped.

Figure 12:
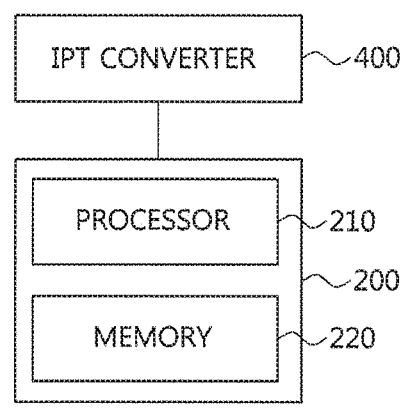
FIG. 12 is a block diagram illustrating a WPT apparatus according to an embodiment of the present disclosure.

FIG. 12 is a block diagram illustrating a WPT apparatus according to an embodiment of the present disclosure.

Referring to FIG. 12, a apparatus according to an embodiment of the present disclosure may comprise an IPT converter 400 and a WPT control apparatus 200.

The WPT control apparatus 200 may comprise at least one processor 210 and a memory 220 for storing at least one instructions executed by the at least one processor.

The at least one instruction stored in the memory 220 in accordance with one embodiment of the present disclosure may cause the at least one processor 210 to perform a ZPA control for the IPT converter, detect a phase difference between an input current and an input voltage of the IPT converter, and determine whether or not a foreign object exists between transmission and reception coils by comparing the phase difference with a threshold value.

The methods according to embodiments of the present disclosure may be implemented as program instructions executable by a variety of computers and recorded on a computer readable medium. The computer readable medium may include a program instruction, a data file, a data structure, or a combination thereof. The program instructions recorded on the computer readable medium may be designed and configured specifically for an exemplary embodiment of the present disclosure or can be publicly known and available to those who are skilled in the field of computer software.

Examples of the computer readable medium may include a hardware device including ROM, RAM, and flash memory, which are configured to store and execute the program instructions. Examples of the program instructions include machine codes made by, for example, a compiler, as well as high-level language codes executable by a computer, using an interpreter. The above exemplary hardware device can be configured to operate as at least one software module to perform the operation of the present disclosure, and vice versa.

While some aspects of the present disclosure have been described in the context of an apparatus, it may also represent a description according to a corresponding method, wherein the block or apparatus corresponds to a method step or a feature of the method step. Similarly, aspects described in the context of a method may also be represented by features of the corresponding block or item or corresponding device. Some or all of the method steps may be performed by (or using) a hardware device such as, for example, a microprocessor, a programmable computer, or an electronic circuit. In various exemplary embodiments, one or more of the most important method steps may be performed by such an apparatus.

In embodiments, a programmable logic device (e.g., a field programmable gate array (FPGA)) may be used to perform some or all of the functions of the methods described herein. In embodiments, the FPGA may operate in conjunction with a microprocessor to perform one of the methods described herein. Generally, the methods are preferably performed by some hardware device.

For convenience in explanation and accurate definition in the appended claims, the terms "upper", "lower", "internal", "outer;" "up", "down", "upper", "lower", "upwards", "downwards", "front", "rear", "back", "inside", "outside", "inwardly", "outwardly", "internal", "external", "internal", "outer", "forwards", and "backwards" are used to describe features of the exemplary embodiments with reference to the positions of such features as displayed in the figures.

The foregoing descriptions of specific \embodiments of the present disclosure have been presented for purposes of illustration and description. They are not intended to be exhaustive or to limit the disclosure to the precise forms disclosed, and obviously many modifications and variations are possible in light of the above teachings. The embodiments were chosen and described to explain certain principles of the disclosure and their practical application, to enable others skilled in the art to make and utilize various embodiments of the present disclosure, as well as various alternatives and modifications thereof. It is intended that the scope of the disclosure be defined by the Claims appended hereto and their equivalents.

What is claimed is:

1. A method for detecting a foreign object between a transmission pad and a reception pad for wireless power transfer (WPT), the method comprising steps of:
    performing, by a processor, a zero phase angle (ZPA) control for a power transfer converter included in or connected to the transmission pad;
    detecting by the processor, a phase difference between an input current and an input voltage of the power transfer converter; and
    determining, by the processor, whether or not the foreign object exists between the transmission pad and the reception pad by comparing the phase difference with a reference value.

2. The method according to claim 1, wherein the phase difference is obtained using a length of a time interval during which the input current and the input voltage have different polarities.

3. The method according to claim 2, wherein the step of determining further comprises:
    comparing the length of the time interval during which the input current and the input voltage have different polarities with a first reference value; and
    determining that the foreign object exists between the transmission pad and the reception pad when the length of the time interval exceeds the first reference value.

4. The method according to claim 1, wherein the phase difference is obtained using a length of a time interval during which the input current and the input voltage have a same polarity.

5. The method according to claim 4, wherein the step of determining further comprises:
    comparing the length of the time interval during which the input current and the input voltage have the same polarity with a second reference value; and
    determining that the foreign object exists between the transmission pad and the reception pad when the length of the time interval is less than the second reference value.

6. The method according to claim 1, wherein, when the ZPA control is performed for the power transfer converter and the foreign object does not exist between the transmission pad and the reception pad, a length of a time interval during which the input current and the input voltage have different polarities becomes a value of 0.

7. The method according to claim 1, further comprising: controlling, by a processor, the power transfer converter to stop the WPT.

8. The method according to claim 1, wherein the ZPA control allows the input voltage and the input current of the power transfer converter to be in-phase.

9. A wireless power transfer (WPT) control apparatus comprising at least one processor and a memory storing at least one instruction executed by the at least one processor, wherein the at least one instruction causes the at least one processor to:
    perform a zero phase angle (ZPA) control for a power transfer converter included in or connected to a transmission pad for WPT;
    detect a phase difference between an input current and an input voltage of the power transfer converter; and
    determine whether or not a foreign object exists between the transmission pad and a reception pad for the WPT by comparing the phase difference with a reference value.

10. The WPT control apparatus according to claim 9, wherein the phase difference is obtained using a length of a time interval during which the input current and the input voltage have different polarities.

11. The WPT control apparatus according to claim 10, wherein the length of the time interval during which the input current and the input voltage have different polarities with a first reference value, and
    the foreign object exists between the transmission pad and the reception pad when the length of the time interval exceeds the first reference value.

12. The WPT control apparatus according to claim 9, wherein the phase difference is obtained using a length of a time interval during which the input current and the input voltage have a same polarity.

13. The WPT control apparatus according to claim 12, wherein the length of the time interval, during which the input current and the input voltage have the same polarity, is compared with a second reference value, and
    the foreign object exists between the transmission pad and reception pad when the length of the time interval is less than the second reference value.

14. The WPT control apparatus according to claim 9, wherein, when the GPA control is performed for tile power transfer converter and the foreign object does not exist between the transmission pad and the reception pad, a length of a time interval during which the input current and the input voltage have different polarities becomes a value of 0.

15. The WPT control apparatus according to claim 9, wherein the at least one processor is further configured to control the power transfer converter to stop the WPT when the foreign object exists between the transmission pad and the reception pad.

16. A wireless power transfer (WPT) apparatus comprising:
- a power transfer converter included in or connected to a transmission pad for WPT, the power transfer converter converting an input voltage to an output voltage by induction power transferring (IPT), and outputting the output voltage;
- at least one processor; and
- a memory storing at least one instruction executed by the at east one processor,
- wherein the at least one instruction is configured to:
  - perform a zero phase angle (ZPA) control for the power transfer converter;
  - detect a phase difference between an input current and an input voltage of the power transfer converter; and
  - determine whether or not a foreign object exists between the transmission pad and a reception pad for the WPT by comparing the phase difference with a reference value.

17. The WPT apparatus according to claim 16, wherein the phase difference is obtained using a length of a time interval during which the input current and the input voltage have different polarities.

18. The WPT apparatus according to claim 17, wherein the length of the time interval, during which the input current and the input voltage have different polarities, is compared with a first reference value; and
- the foreign object exists between the transmission pad and the reception pad when the length of the time interval exceeds the first reference value.

19. The WPT apparatus according to claim 16, wherein the phase difference is obtained using a length of a time interval during which the input current and the input voltage have a same polarity.

20. The WPT apparatus according to claim 19, wherein the length of the time interval, during which the input current and the input voltage have the same polarity, is compared with a second reference value; and
- the foreign object exists between the transmission pad and the reception pad when the length of the time interval is less than the second reference value.

* * * * *